(12) United States Patent
Lee et al.

(10) Patent No.: US 10,359,663 B2
(45) Date of Patent: Jul. 23, 2019

(54) HIGH-LUMINANCE DISPLAY APPARATUS

(71) Applicant: Samsung Display Co., Ltd., Yongin-si, Gyeonggi-do (KR)

(72) Inventors: Minsu Lee, Yongin-si (KR);
Maidanchuk Ivan, Yongin-si (KR);
Seungrok Lee, Yongin-si (KR);
Wonbaek Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/403,968

(22) Filed: Jan. 11, 2017

(65) Prior Publication Data

US 2018/0100956 A1 Apr. 12, 2018

(30) Foreign Application Priority Data

Oct. 11, 2016 (KR) .................. 10-2016-0131272

(51) Int. Cl.
| | |
|---|---|
| *G02B 5/20* | (2006.01) |
| *G02B 5/30* | (2006.01) |
| *H01L 27/32* | (2006.01) |
| *G02F 1/1335* | (2006.01) |

(52) U.S. Cl.
CPC ....... *G02F 1/133514* (2013.01); *G02B 5/204* (2013.01); *G02B 5/206* (2013.01); *G02B 5/3058* (2013.01); *G02F 1/133617* (2013.01); *G02B 5/201* (2013.01); *G02F 2001/133614* (2013.01); *G02F 2202/36* (2013.01); *G02F 2203/055* (2013.01); *H01L 27/322* (2013.01)

(58) Field of Classification Search
CPC . G02B 5/204; H01L 27/322; G02F 1/133514; G02F 1/133617; G02F 2202/36; G02F 2203/01; G02F 2203/055; G02F 2001/133614; G02F 1/133512; G02F 1/136209; G02F 1/13473; G02F 1/133371; G02F 2001/13622; G02F 2001/136218; G02F 1/133603; H01J 11/44; H01J 2211/444; H01J 2329/323; H01J 29/327
USPC ..................... 349/106–111, 69–71
See application file for complete search history.

(56) References Cited

U.S. PATENT DOCUMENTS

| | | | |
|---|---|---|---|
| 7,982,812 B2 | 7/2011 | Rho et al. | |
| 2012/0326180 A1* | 12/2012 | Ohe | H01L 27/322 |
| | | | 257/88 |
| 2015/0285969 A1* | 10/2015 | Kim | G02B 5/201 |
| | | | 359/891 |

(Continued)

FOREIGN PATENT DOCUMENTS

| | | |
|---|---|---|
| KR | 10-2006-0024545 A | 3/2006 |
| KR | 10-2009-0036373 A | 4/2009 |

(Continued)

OTHER PUBLICATIONS

English translation of KR 20130103899 A, Title: White-LED Device Using Surface Plasmon Resonance of Metallic Nanoparticle, Author: Kim Myeong Cheol, Lee Seong Min, Choi Kyung Cheol; Date of publication: Sep. 25, 2013.*

(Continued)

*Primary Examiner* — Shan Liu
(74) *Attorney, Agent, or Firm* — Innovation Counsel LLP

(57) ABSTRACT

A color filter includes a first filter. The first filter includes a first color forming material, a first quantum dot, and a first metal nanoparticle, the first filter exhibiting a first color.

17 Claims, 11 Drawing Sheets

(56) References Cited

U.S. PATENT DOCUMENTS

| | | | | |
|---|---|---|---|---|
| 2015/0293280 A1* | 10/2015 | Lee | ........................ | G02B 5/201 |
| | | | | 359/891 |
| 2015/0309359 A1* | 10/2015 | Wu | ................... | G02F 1/133514 |
| | | | | 359/891 |
| 2016/0020414 A1* | 1/2016 | Gu | ........................ | C09K 11/025 |
| | | | | 252/512 |
| 2016/0202400 A1 | 7/2016 | Lee et al. | | |
| 2017/0102487 A1* | 4/2017 | Lee | ........................ | G02B 5/206 |

FOREIGN PATENT DOCUMENTS

| | | | | |
|---|---|---|---|---|
| KR | 20130103899 A | * | 9/2013 | |
| KR | 10-2014-0059368 A | | 5/2014 | |
| KR | 10-2016-0060904 A | | 5/2016 | |
| KR | 20160120413 A | * | 10/2016 | |
| KR | 10-2017-0041951 A | | 4/2017 | |

OTHER PUBLICATIONS

English translation of KR 20130103899A from Google, Title: White-LED Device Using Surface Plasmon Resonance of Metallic Nanoparticle, Author: Kim Myeong Cheol, Lee Seong Min, Choi Kyung Cheol; Date of publication: Sep. 25, 2013.*

English translation of KR-20160120413-A, Title: Light guide plate optical sheet and backlight unit; Author: Lee Chang Hee [KR]; Park Myeong Jin [KR]; Jung Hee Young [KR]; Song Hyung Jun [KR]; Kwon Yong Won [KR]; Lee Yeon Kyung ; Date of publication: Oct. 18, 2016 (Year: 2016).*

* cited by examiner

HIGH-LUMINANCE DISPLAY APPARATUS

CROSS-REFERENCE TO RELATED APPLICATION

This application claims the benefit of Korean Patent Application No. 10-2016-0131272, filed on Oct. 11, 2016, in the Korean Intellectual Property Office, the disclosure of which is incorporated herein in its entirety by reference.

BACKGROUND

1. Field

One or more example embodiments relate to a color filter and a display apparatus including the color filter.

2. Description of the Related Art

Color filters are used in various types of display apparatuses to form a color of each pixel. Color filters typically include a red filter region, a green filter region, and a blue filter region, and form a color by transmitting, out of light incident upon each color filter region, only light of a color corresponding to the color filter region. Accordingly, the amount of light transmitted by each filter region is only about ⅓ of the amount of incident light, causing degradation in luminance.

To address this luminance degradation, various methods, such as adding a fluorescent dye to a color filter, have been attempted.

SUMMARY

One or more example embodiments include a color filter with high light efficiency and a high-luminance display apparatus including the color filter.

Additional aspects will be set forth in part in the description which follows and, in part, will be apparent from the description, or may be learned by practice of the presented embodiments.

According to one or more embodiments, a color filter includes a first filter comprising a first color forming material, a first quantum dot, and a first metal nanoparticle having a first predetermined size, the first filter exhibiting a first color.

The color filter further includes a second filter including a second color forming material, a second quantum dot having a different size from the first quantum dot, and a second metal nanoparticle having a second predetermined size, the second filter exhibiting a second color. The second predetermined size may be larger than the first predetermined size.

The first color may have a wavelength shorter than that of the second color.

Each of the first metal nanoparticle and the second metal nanoparticle may have a shape with a non-angulated curved surface.

Each of the first metal nanoparticle and the second metal nanoparticle may have a spherical shape.

A plurality of first metal nanoparticles and a plurality of second metal nanoparticles may be included in the first filter and the second filter, respectively, and the first metal nanoparticles and the second metal nanoparticles may be spaced apart from each other.

The first metal nanoparticle and the first quantum dot may be spaced apart from each other, and the second metal nanoparticle and the second quantum dot may be spaced apart from each other.

A distance between the first metal nanoparticle and the first quantum dot may be determined such that the first metal nanoparticle and the first quantum dot form a resonance structure. A distance between the second metal nanoparticle and the second quantum dot may be determined such that the second metal nanoparticle and the second quantum dot form a resonance structure.

Graft molecules may be further formed on surfaces of the first metal nanoparticle and the second metal nanoparticle.

The first metal nanoparticle and the second metal nanoparticle may include Au, Ag, Al, $Al_2O_3$, Co, Cu, Cr, Pt, Ni, Fe, Mo, or W.

The color filter may further include a third filter exhibiting a third color, the third filter including a third color forming material, a third quantum dot having a different size from the first and second quantum dots, and a third metal nanoparticle having a third predetermined size which is different from the first predetermined size and the second predetermined size.

The third predetermined may be is longer than those of the first predetermined size and the second predetermined size. The first color may have a wavelength shorter than that of the second color and the second color may have a wavelength shorter than that of the third color.

The first quantum dot may have a size smaller than that of the second quantum dot and the second quantum dot may have a size smaller than that of the third quantum dot.

According to one or more embodiments, a display apparatus includes a display unit including a plurality of pixel regions controlled according to an image signal; and a color filter including a plurality of filter regions respectively corresponding to the plurality of pixel regions. The color filter includes a first filter including a first color forming material, a first quantum dot, and a first metal nanoparticle, the first filter exhibiting a first color; and a second filter including a second color forming material, a second quantum dot having a different size from the first quantum dot, and a second metal nanoparticle having a different size from the first metal nanoparticle, the second filter exhibiting a second color.

The display unit may be an organic light-emitting panel that emits blue light.

The display unit may be a transmissive type liquid crystal panel, and the display apparatus may further include a backlight unit that provides blue light.

The color filter may further include a third filter including a third color forming material, a third quantum dot having a different size from the first and second quantum dots, and a third metal nanoparticle having a different size from the first and second metal nanoparticles, the third filter exhibiting a third color.

Each of the first metal nanoparticle, the second metal nanoparticle, and the third metal nanoparticle may have a shape with a non-angulated curved surface.

A metal nanoparticle included in a filter that exhibits a color of a longer wavelength, from among the first metal nanoparticle, the second metal nanoparticle, and the third metal nanoparticle, may have a larger size than the other metal nanoparticles.

The display unit may be a transmissive type liquid crystal panel, and the display apparatus may further include a backlight unit that provides ultraviolet (UV) light.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
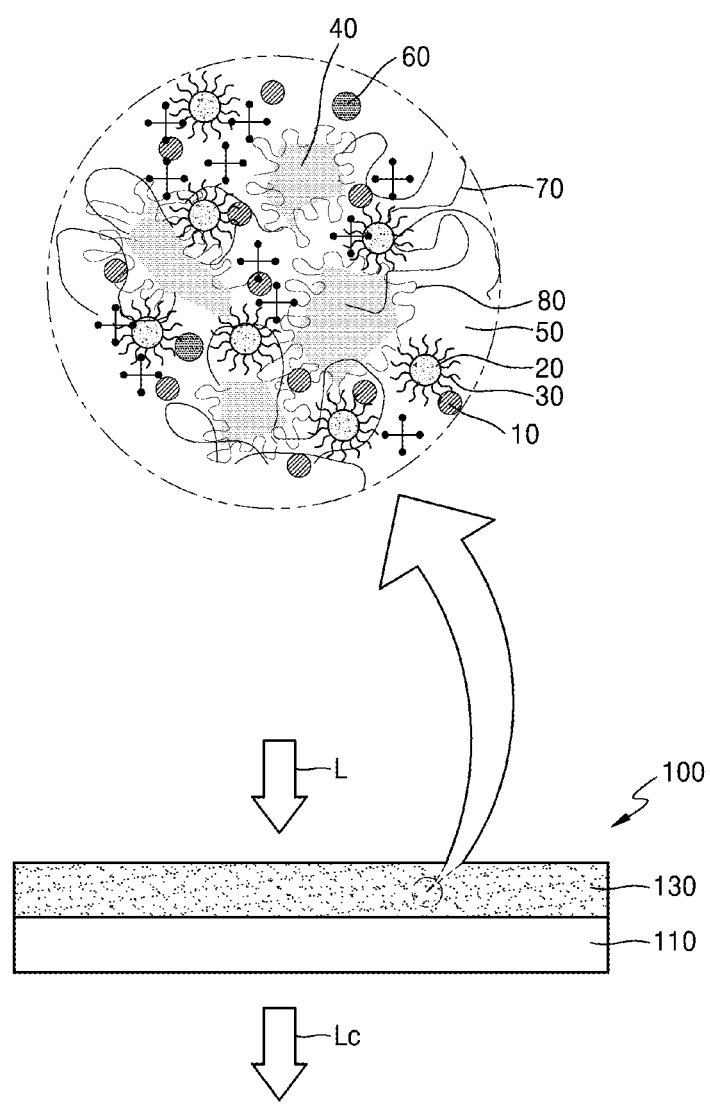
FIG. 1 is a schematic cross-sectional view of a structure of a color filter according to an embodiment and a magnification of a portion of the color filter.

As the inventive concept allows for various changes and numerous embodiments, particular embodiments will be illustrated in the drawings and described in detail in the written description. Hereinafter, effects and features of the present inventive concept and a method for accomplishing them will be described more fully with reference to the accompanying drawings, in which embodiments of the inventive concept are shown. This inventive concept may, however, be embodied in many different forms and should not be construed as limited to the embodiments set forth herein.

One or more embodiments of the inventive concept will be described below in more detail with reference to the accompanying drawings. Those components that are the same or are in correspondence are rendered the same reference numeral regardless of the figure number, and redundant explanations are omitted.

It will be understood that although the terms "the first", "the second", etc. may be used herein to describe various components, these components should not be limited by these terms. These components are only used to distinguish one component from another.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

In the drawings, the thicknesses of layers and regions are exaggerated or minimized for convenience of explanation. In other words, since sizes and thicknesses of components in the drawings are arbitrarily illustrated for convenience of explanation, the following embodiments are not limited thereto.

FIG. 1 is a schematic cross-sectional view illustrating a structure of a color filter 100 according to an embodiment and a magnification of a portion of the color filter 100.

To emit color light Lc from among incident light L, the color filter 100 includes a filter material layer 130 including a color forming material 40, quantum dots 10, and metal nanoparticles 20. The filter material layer 130 may be formed on a transparent substrate 110.

The color forming material 40 is capable of generating a color, and various materials may be used as the color forming material 40. For example, the color forming material 40 may include at least one of a dye, a pigment, a fluorescent material, and a phosphorescent material.

The quantum dots 10 have excitation properties and emission properties intrinsic to the material and size thereof and accordingly may convert the incident light into color light. The quantum dots 10 may be formed of any of various materials. For example, the quantum dots 10 may be formed of a Groups II-VI elements-containing compound, a Groups III-V elements-containing compound, a Groups IV-VI elements-containing compound, a Group IV element, a Group IV element-containing compound, or a combination thereof. The Groups II-VI elements-containing compound may be a two-element compound selected from the group consisting of CdSe, CdTe, ZnS, ZnSe, ZnTe, ZnO, HgS, HgSe, HgTe, MgSe, MgS, and a mixture thereof; a three-element compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; or a four-element compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Groups III-V elements-containing compound may be a two-element compound selected from the group consisting of GaN, GaP, GaAs, GaSb, AlN, AlP, AlAs, AlSb, InN, InP, InAs, InSb, and a mixture thereof; a three-element compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; or a four-element compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Groups IV-VI elements-containing compound may be a two-element compound selected from the group consisting of SnS, SnSe, SnTe, PbS, PbSe, PbTe, and a mixture thereof; a three-element compound selected from the group consisting of SnSeS, SnSeTe, SnSTe, PbSeS, PbSeTe, PbSTe, SnPbS, SnPbSe, SnPbTe, and a mixture thereof; or a four-element compound selected from the group consisting of SnPbSSe, SnPbSeTe, SnPbSTe, and a mixture thereof. The Group IV element may be one of Si, Ge, and a mixture thereof. The Group IV element-containing compound may be a two-element compound selected from SiC, SiGe, and a mixture thereof.

Each of the quantum dots 10 may have a core-shell structure having a core and a shell.

The metal nanoparticles 20 amplify color light excited and emitted by the quantum dots 10. The metal nanoparticles 20 undergo a polarization phenomenon due to light. The polarization phenomenon is associated with extinction of photons on the surfaces of the metal nanoparticles 20. A polarization distribution of the metal nanoparticles 20 varies depending on a material, a shape, and a size of the metal nanoparticles 20. In other words, extinction of photons increases at a specific wavelength. The increase in extinction of photons increases excitation of electrons of the quantum dots 10 adjacent to the metal nanoparticles 20. As the number of excited electrons increases, emission by the quantum dots 10 also increases. This phenomenon may be explained as occurring due to localized surface plasmon resonance of the metal nanoparticles 20.

The metal nanoparticles 20 may include one of Ag, Al, $Al_2O_3$, Co, Cu, Cr, Pt, Ni, Fe Mo, W, and the like.

The metal nanoparticles 20 may each have a sphere shape, but embodiments are not limited thereto. For example, each metal nanoparticle 20 may have a shape with a non-angulated curved surface, such as an oval shape or any of various curved shapes having a circular or oval cross-section. The size of each metal nanoparticle 20 may be determined to be a size at which the metal nanoparticle 20 is capable of increasing emission of the quantum dots 10.

Extinction of photons by the metal nanoparticles 20 may be expressed as an extinction cross section σExt representing a photon-absorbing rate per unit area. When each of the metal nanoparticles 20 is assumed to have a spherical shape, the extinction cross section $\sigma_{Ext}$ may be calculated using Equation (1):

$$\sigma_{Ext} = \sigma_{Abs} + \sigma_{Sca} \tag{1}$$

$$\sigma_{Sca} = \frac{8\pi}{3} k^4 a^6 \left| \frac{\varepsilon - \varepsilon_m}{\varepsilon + 2\varepsilon_m} \right|$$

$$\sigma_{Abs} = 4\pi k a^3 \mathrm{Im} \left| \frac{\varepsilon - \varepsilon_m}{\varepsilon + 2\varepsilon_m} \right|$$

where $\sigma_{Abs}$ and $\sigma_{Sca}$ indicate an absorption cross section and a scattering cross section, respectively, k indicates $2\pi/\lambda$, λ indicates a wavelength, a indicates the radius of a sphere, ε indicates a permittivity of the metal nanoparticles 20, and $\varepsilon_m$ indicates a permittivity of a material around the metal nanoparticles 20.

It may be expected from Equation (1) above that an optimal size representing a maximum extinction property according to a wavelength of light incident on the metal nanoparticles 20 may exist.

Graft molecules 30 may be further formed on the surfaces of the metal nanoparticles 20. The graft molecules 30 may be an alkyl group, dodecane, or any of various hydrocarbon groups having a carbon number of 6 to 20. The graft molecules 30 formed on the surfaces of the metal nanoparticles 20 may separate the metal nanoparticles 20 from one another and separate the metal nanoparticles 20 from the quantum dots 10.

A plurality of metal nanoparticles 20 are included and are arranged separate from one another. As described above, because the sizes of the metal nanoparticles 20 affect the properties of the color filter 100, when the metal nanoparticles 20 are arranged without intervals, each metal nanoparticle 20 has a different size from an intended size as a result.

The metal nanoparticles 20 and the quantum dots 10 need to be spaced apart from each other. When the intervals between the metal nanoparticles 20 and the quantum dots 10 are not maintained, emission by the quantum dots 10 may be quenched by the metal nanoparticles 20. An appropriate distance needs to be maintained between the metal nanoparticles 20 and the quantum dots 10. For example, the distance between the metal nanoparticles 20 and the quantum dots 10 may be determined such that a resonance structure is formed therebetween.

In addition to the color forming material 40, the quantum dots 10, and the metal nanoparticles 20, the filter material layer 130 may include various other materials that mix and adequately disperse the color forming material 40, the quantum dots 10, and the metal nanoparticles 20. For example, the filter material layer 130 may further include a solvent 50, a photoinitiator 60, a binder polymer 70, and a dispersant 80, but embodiments are not limited thereto.

Figure 2:
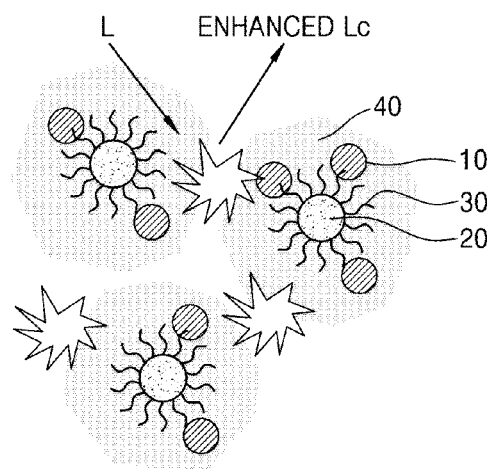
FIG. 2 is a conceptual diagram illustrating how the color filter emits high-luminance color light by using incident light as exciting light.

FIG. 2 is a conceptual diagram illustrating how the color filter 100 emits high-luminance color light by using incident light as exciting light.

Each of the color forming material 40, the quantum dots 10, and the metal nanoparticles 20, which are included in the color filter 100, reacts to the incident light L, and consequently, the filter material layer 130 emits the color light Lc. In other words, color formation by the color forming material 40, excitation and emission by the quantum dots 10, and amplification of the excited and emitted color light from the quantum dots 10 by the metal nanoparticles 20 contribute to the emission of the color light Lc. The color filter 100 further performs amplification due to the localized surface plasmon resonance of the metal nanoparticles 20 in addition to emission by an existing quantum-dot color filter, and thus high-luminance color light Lc may be emitted.

Figure 3:
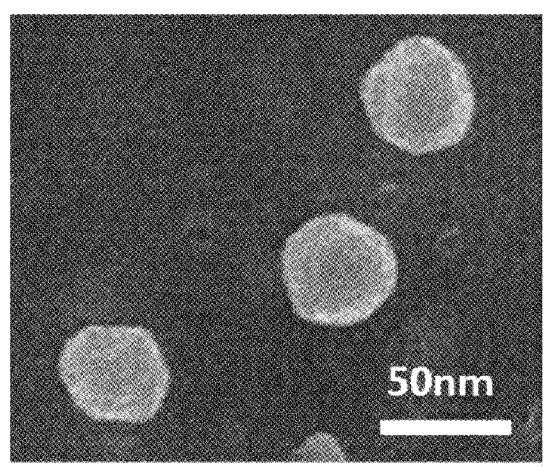
FIG. 3 is a microscopic picture of example metal nanoparticles that may be included in the color filter.
Figure 4:
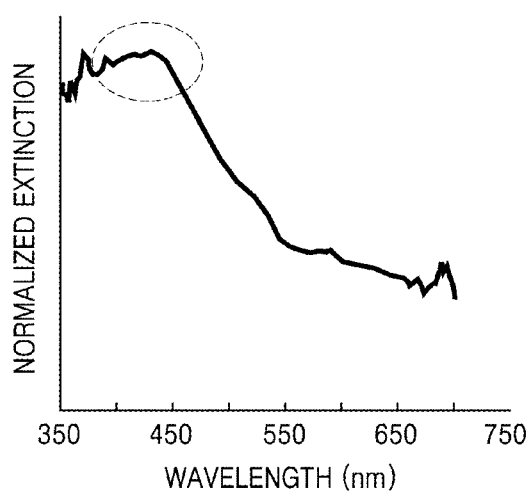
FIG. 4 is a graph of photon extinction by the metal nanoparticles having sizes illustrated in FIG. 3 versus wavelength of light.

FIG. 3 is a microscopic picture of example metal nanoparticles that may be included in the color filter 100. FIG. 4 is a graph of photon extinction by the metal nanoparticles having sizes illustrated in FIG. 3 versus wavelength of light.

The metal nanoparticles of FIG. 3 are formed of silver (Ag), and each has a shape like a sphere having a radius of about 20 nm to about 40 nm. Referring to FIG. 4, maximum extinction appears at a wavelength of about 440 nm to about 460 nm.

Figure 5:
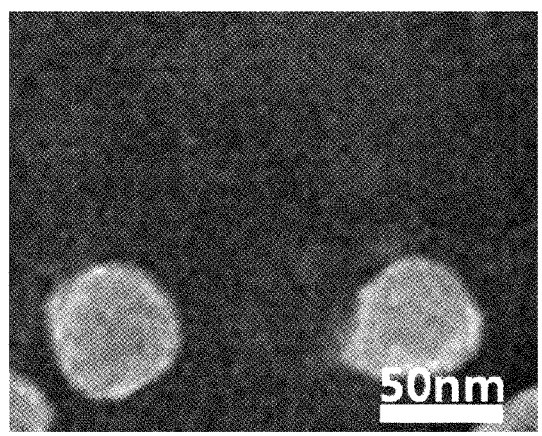
FIG. 5 is a microscopic picture of example metal nanoparticles that may be included in the color filter.
Figure 6:
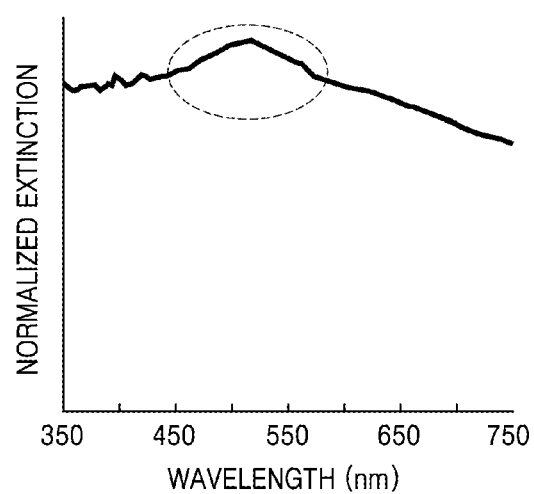
FIG. 6 is a graph of photon extinction by the metal nanoparticles having sizes illustrated in FIG. 5 versus wavelength of light.

FIG. 5 is a microscopic picture of example metal nanoparticles that may be included in the color filter 100. FIG. 6 is a graph of photon extinction by the metal nanoparticles having sizes illustrated in FIG. 5 versus wavelength of light.

The metal nanoparticles of FIG. 5 are formed of Ag, and each has a shape like a sphere having a radius of about 40 nm to about 70 nm. Referring to FIG. 6, maximum extinction appears at a wavelength of about 510 nm to about 525 nm.

Figure 7:
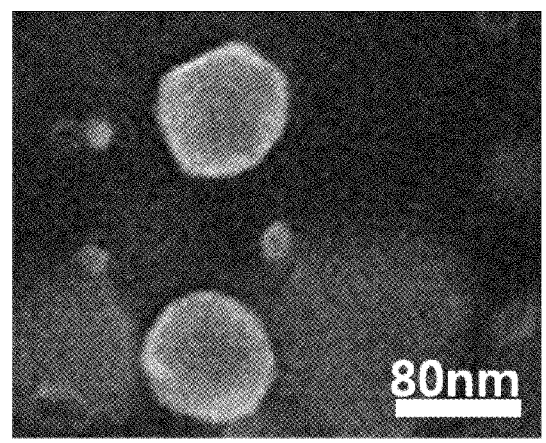
FIG. 7 is a microscopic picture of example metal nanoparticles that may be included in the color filter.
Figure 8:
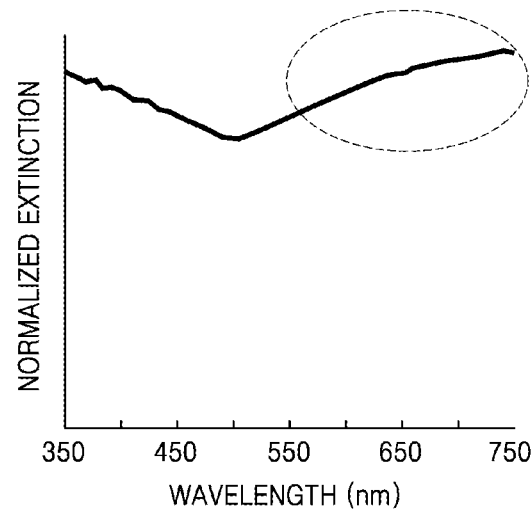
FIG. 8 is a graph of photon extinction by the metal nanoparticles having sizes illustrated in FIG. 7 versus wavelength of light.

FIG. 7 is a microscopic picture of example metal nanoparticles that may be included in the color filter 100. FIG. 8 is a graph of photon extinction by the metal nanoparticles having sizes illustrated in FIG. 7 versus wavelength of light.

The metal nanoparticles of FIG. 7 are formed of Ag, and each has a shape like a sphere having a radius of about 70 nm to about 100 nm. Referring to FIG. 8, extinction continuously increases as the wavelength of light increases from about 510 nm.

As described above with reference to FIGS. 3-8, a wavelength band at which maximum extinction appears varies according to sizes of each metal nanoparticle 20. This is in accordance with the description of Equation (1).

Figure 9:
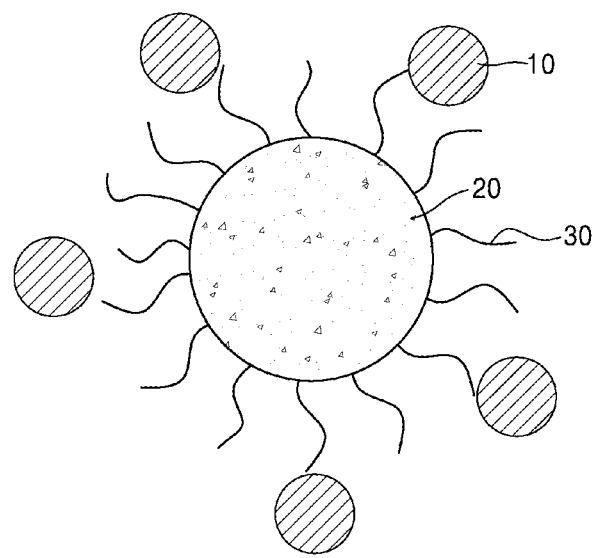
FIG. 9 illustrates an example in which graft molecules are formed on the surface of a metal nanoparticle in the color filter.
Figure 10:
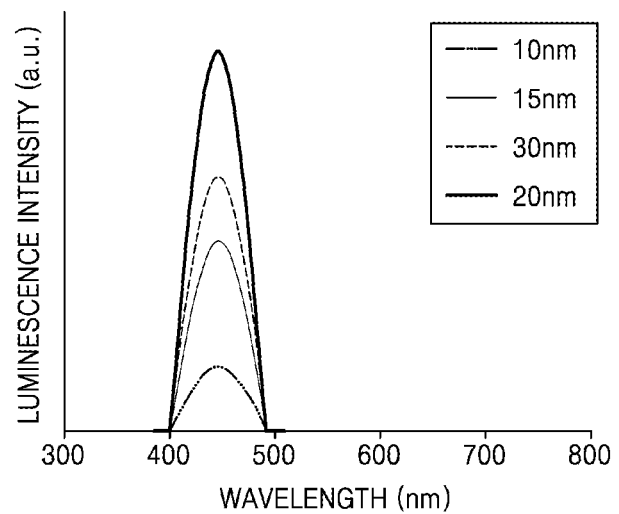
FIG. 10 is a graph of luminescence intensity versus wavelength of light according to different lengths of graft molecules formed on the surface of each metal nanoparticle in the color filter.

FIG. 9 illustrates an example in which graft molecules 30 are formed on the surface of a metal nanoparticle 20 in the color filter 100 according to an embodiment. FIG. 10 is a graph of luminescence intensity versus wavelength of light according to lengths of graft molecules 30 formed on the surface of each metal nanoparticle 20.

The luminescence intensities shown in the graph of FIG. 10 are results obtained in consideration of only the metal nanoparticles 20 and the quantum dots 10, and are used to confirm that a length of a graft molecule affects luminance of a color filter. Referring to FIG. 10, when the length of a graft molecule is shortest, namely, 10 nm, luminescence intensity is low due to quenching, and, as the length of a graft molecule increases, luminescence intensity increases and then decreases. It can be seen from the graph of FIG. 10 that emission of the quantum dots 10 may be maximally amplified by adjusting distances between the metal nanoparticles 20 and the quantum dots 10.

Effects of existence or absence of metal nanoparticles and the sizes thereof on luminescence intensity of color light emitted by a color filter will now be described with reference to FIGS. 11-15, via comparisons between various comparative examples and various embodiments.

Figure 11:
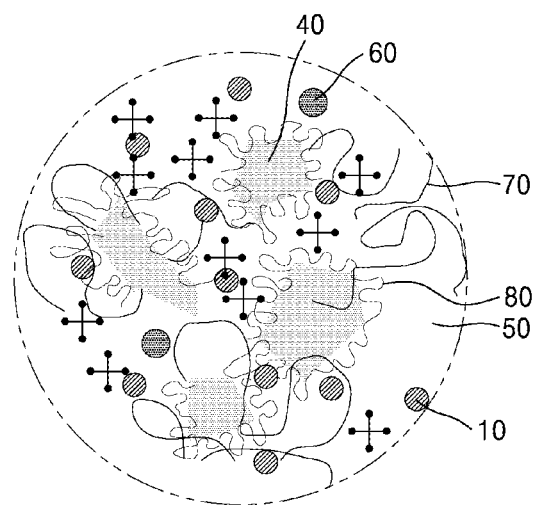
FIG. 11 is a magnified view of materials that form a color filter according to a comparative example.

FIG. 11 is a magnified view of materials that form a color filter according to a comparative example.

The materials that form the color filter according to a comparative example are mostly the same as the materials that form the color filter 100 of FIG. 1, and are different from those of FIG. 1 only in that no metal nanoparticles are included. In other words, the color filter according to a comparative example includes the color forming material 40 and the quantum dots 10, and further includes the solvent 50, the binder polymer 70, the photoinitiator 60, and the dispersant 80 for mixing and dispersing the color forming material 40 and the quantum dots 10.

Figure 12:
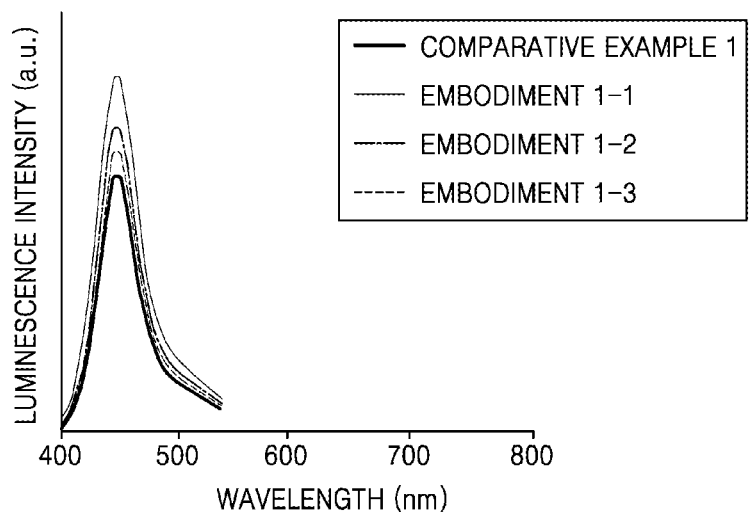
FIG. 12 is a graph of luminescence intensity versus wavelength of light for color filters according to a comparative example and embodiments that realize a blue color.

FIG. 12 is a graph of luminescence intensity versus wavelength of light for color filters according to a comparative example and embodiments that realize a blue color.

In FIG. 12, Comparative Example 1 is a case where a color forming material and quantum dots are designed to have materials and sizes that realize a blue color, and in which no metal nanoparticles are contained, and Embodiments 1-1, 1-2, and 1-3 are cases where color forming materials and quantum dots of a color filter are designed to have materials and sizes that realize a blue color, wherein metal nanoparticles contained therein have sizes of 20-40 nm, 40-70 nm, and 70-100 nm, respectively. Both an absorptive material and a fluorescent material were used as the color forming materials. The size of each metal nanoparticle denotes a radius when the shape of each metal nanoparticle approximates to a sphere.

Referring to FIG. 12, Comparative Example 1, in which no metal nanoparticles are contained, exhibits the lowest luminescence intensity peak. In embodiments in which metal nanoparticles are contained, luminescence intensity peaks have different heights according to the sizes of the metal nanoparticles. Embodiment 1-1, in which the metal nanoparticles contained therein have sizes of 20-40 nm, exhibits the highest luminescence intensity peak.

Figure 13:
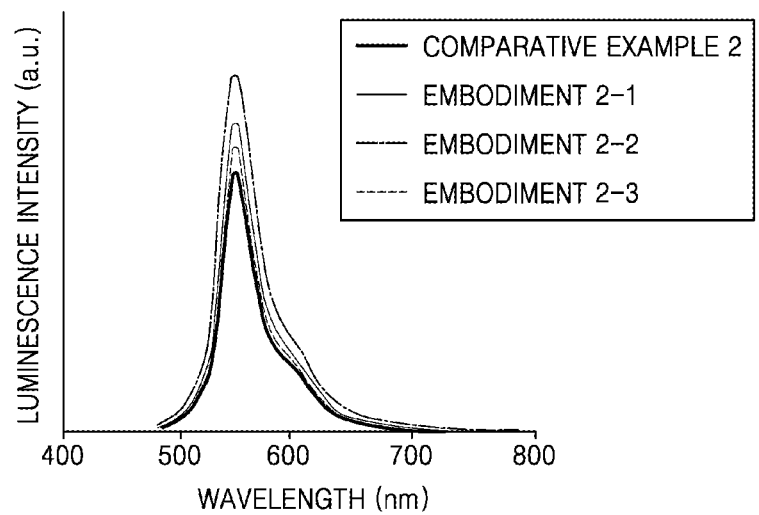
FIG. 13 is a graph of luminescence intensity versus wavelength of light for color filters according to a comparative example and embodiments that realize a green color.

FIG. 13 is a graph of luminescence intensity versus wavelength of light for color filters according to a comparative example and embodiments that realize a green color.

In FIG. 13, Comparative Example 2 is a case where a color forming material and quantum dots are designed to have materials and sizes that realize a green color, and in which no metal nanoparticles are contained, and Embodiments 2-1, 2-2, and 2-3 are cases where color forming materials and quantum dots are designed to have materials and sizes that realize a green color, wherein metal nanoparticles therein have sizes of 20 to 40 nm, 40 to 70 nm, and 70 to 100 nm, respectively. Both an absorptive material and a fluorescent material were used as the color forming materials. The size of each metal nanoparticle denotes a radius when the shape of each metal nanoparticle approximates to a sphere.

Referring to FIG. 13, Comparative Example 2, in which no metal nanoparticles are contained, exhibits the lowest luminescence intensity peak. The embodiments in which metal nanoparticles are contained exhibit luminescence intensity peaks having different heights according to the sizes of the metal nanoparticles. Embodiment 2-2 in which metal nanoparticles have sizes of 40 to 70 nm exhibits the highest luminescence intensity peak.

Figure 14:
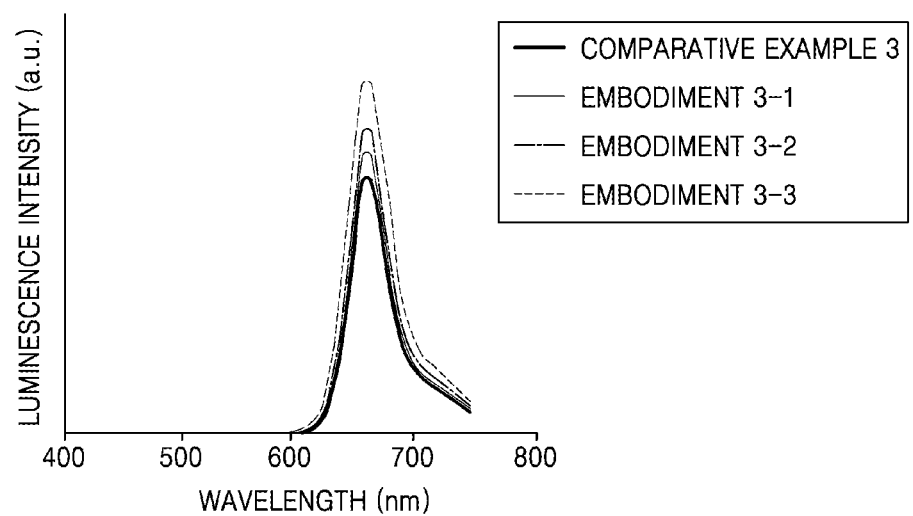
FIG. 14 is a graph of luminescence intensity versus wavelength of light for color filters according to a comparative example and embodiments that realize a red color.
Figure 15:
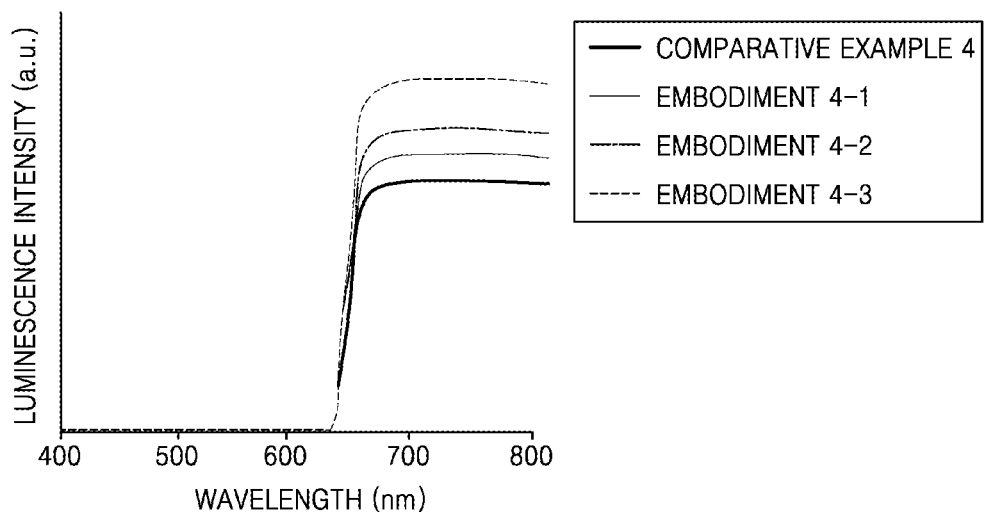
FIG. 15 is a graph of luminescence intensity versus wavelength of light for color filters according to another comparative example and other embodiments that realize a red color.

FIGS. 14 and 15 are graphs of luminescence intensity versus wavelength of light for color filters according to comparative examples and embodiments that realize a red color, wherein FIGS. 14 and 15 are different in terms of a type of color forming material.

In FIG. 14, Comparative Example 3 is a case where a color forming material and quantum dots are designed to have materials and sizes that realize a red color, and in which no metal particles are contained, and Embodiments 3-1, 3-2, and 3-3 are cases where color forming materials and quantum dots are designed to have materials and sizes that realize a red color, wherein metal nanoparticles contained therein have sizes of 20 to 40 nm, 40 to 70 nm, and 70 to 100 nm, respectively. The size of each metal nanoparticle denotes a radius when the shape of each metal nanoparticle is spherical. In all of Comparative Example 3 and Embodiments 3-1, 3-2, and 3-3, an absorptive material was not used in the color forming materials.

Referring to FIG. 14, Comparative Example 3, in which no metal nanoparticles are contained, exhibits the lowest luminescence intensity peak. The embodiments in which metal nanoparticles are contained exhibit luminescence intensity peaks having different heights according to the sizes of the metal nanoparticles. Embodiment 3-3, in which metal nanoparticles have sizes of 70 to 100 nm, exhibits the highest luminescence intensity peak.

In FIG. 15, Comparative Example 4 is a case where a color forming material and quantum dots are designed to have materials and sizes that realize a red color, and in which no metal nanoparticles are contained, and Embodiments 4-1, 4-2, and 4-3 are cases where color forming materials and quantum dots are designed to have materials and sizes that realize a red color, wherein metal nanoparticles contained therein have sizes of 20 to 40 nm, 40 to 70 nm, and 70 to 100 nm, respectively. In all of Comparative Example 4 and Embodiments 4-1, 4-2, and 4-3, both an absorptive material and a fluorescent material were used as the color forming materials.

Referring to FIG. 15, Comparative Example 4, in which no metal nanoparticles are contained, exhibits the lowest luminescence intensity peak. The embodiments in which metal nanoparticles are contained exhibit luminescence intensity peaks having different heights according to the sizes of the metal nanoparticles. Embodiment 4-3, in which metal nanoparticles have sizes of 70 to 100 nm, exhibits the highest luminescence intensity peak.

It can be seen from these results that luminescence of the color filter may be increased by selecting an optimal value as the size of each metal nanoparticle according to a color to be realized by a color filter. When a color filter is constructed by including filters that form a plurality of different colors, and realization of a long-wavelength color is desired, increasing the sizes of the metal nanoparticles contained in the color filter is favorable to luminance improvement.

Figure 16:
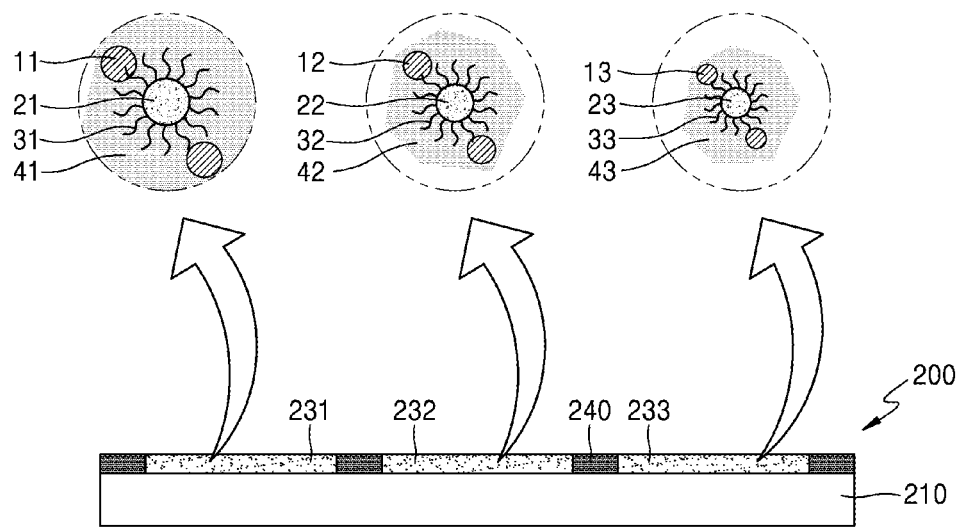
FIG. 16 is a schematic cross-sectional view of a structure of a color filter according to another embodiment and a magnification of a portion of the color filter.

FIG. 16 is a schematic cross-sectional view illustrating a structure of a color filter 200 according to another embodiment and a magnification of a portion of the color filter 200.

The color filter 200 includes a first filter 231 that realizes a first color, a second filter 232 that realizes a second color, and a third filter 233 that realizes a third color. The first filter 231, the second filter 232, and the third filter 233 may be located on areas of a transparent substrate 210 that are defined by a black matrix 240.

The first filter 231 includes a first color forming material 41, first quantum dots 11, and first metal nanoparticles 21. The first color forming material 41 may include various materials that realize the first color. Each first quantum dot 11 may have a size suitable for emission of the first color. Graft molecules 31 may be formed on the surface of each first metal nanoparticle 21, and accordingly, appropriate distances may be maintained between the first metal nanoparticles 21 and the first quantum dots 11. The first color may be red.

The second filter 232 includes a second color forming material 42, second quantum dots 12 having different sizes from the first quantum dots 11, and second metal nanoparticles 22 having different sizes from the first metal nanoparticles 21. The second color forming material 42 may include various materials that realize the second color. Each second quantum dot 12 may have a size suitable for emission of the second color. Graft molecules 32 may be formed on the surface of each second metal nanoparticle 22, and accordingly, appropriate distances may be maintained between the second metal nanoparticles 22 and the second quantum dots 12. The second color may be green. When the first color is red and the second color is green, the second quantum dots 12 have smaller sizes than the first quantum dots 11. The second metal nanoparticles 22 have smaller sizes than the first metal nanoparticles 21.

The third filter 233 includes a third color forming material 43, third quantum dots 13 having different sizes from the first and second quantum dots 11 and 12, and third metal nanoparticles 23 having different sizes from the first and second metal nanoparticles 21 and 22. Each third quantum dot 13 may have a size suitable for emission of the third color. Graft molecules 33 may be formed on the surface of each third metal nanoparticle 23, and accordingly, appropriate distances may be maintained between the third metal nanoparticles 23 and the third quantum dots 13. The third color may be blue. When the second color is green and the third color is blue, the third quantum dots 13 have smaller sizes than the second quantum dots 12. The third metal nanoparticles 23 have smaller sizes than the second metal nanoparticles 22.

The first through third metal nanoparticles 21, 22, and 23 may have spherical shapes, but embodiments are not limited thereto, and they have a shape with a non-angulated curved surface. When the first through third metal nanoparticles 21, 22, and 23 have spherical shapes, the sizes of the first through third metal nanoparticles 21, 22, and 23 may be diameters thereof. When the first through third metal nanoparticles 21, 22, and 23 have curved shapes, the sizes of the first through third metal nanoparticles 21, 22, and 23 may be largest diagonal lengths thereof.

Figure 17:
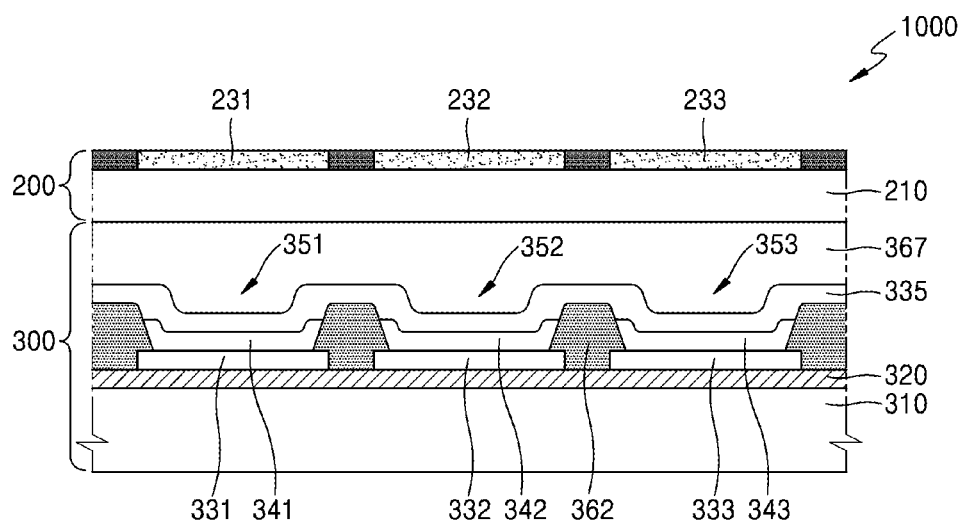
FIG. 17 is a schematic cross-sectional view of a structure of an organic light-emitting display apparatus according to an embodiment.

FIG. 17 is a schematic cross-sectional view of a structure of an organic light-emitting display apparatus 1000 according to an embodiment.

Referring to FIG. 17, the organic light-emitting display apparatus 1000 includes an organic light emitting display (OLED) panel 300 and a color filter 200.

The OLED panel 300 includes a substrate 310, and organic light emitting devices 351, 352, and 353 formed on the substrate 310. The color filter 200 may include first through third filters 231, 232, and 233 arranged to respectively correspond to the organic light emitting devices 351, 352, and 353, and the first through third filters 231, 232, and 233 may form a red color, a green color, and a blue color, respectively. The color filter 200 may be the color filter 200 of FIG. 16.

The organic light emitting device 351 includes an anode 331, an organic emission layer 341, and a cathode 335. The organic light emitting device 352 includes an anode 332, an organic emission layer 342, and the cathode 335, and the organic light emitting device 353 includes an anode 333, an organic emission layer 343, and the cathode 335.

The organic light emitting devices 351, 352, and 353 may include the organic emission layers 341, 342, and 343, respectively, to realize a red color, a green color, and a blue color, respectively.

Alternatively, all of the organic light emitting device 351, 352, and 353 may be constructed to realize a white color. To realize a white color, each of the organic light emitting device 351, 352, and 353 may employ a structure in which emission layers that respectively realize a red color, a green color, and a blue color, are vertically stacked. In this structure, a charge generation layer may be further formed to increase efficiency among the emission layers that respectively realize a red color, a green color, and a blue color.

Alternatively, all of the organic light emitting device 351, 352, and 353 may be constructed to realize a blue color. In this case, the third filter 233 of the color filter 200 may be transformed into a transparent layer. The transparent layer may be formed of a photoresist material.

Although each of the organic emission layers 341, 342, and 343 is illustrated as a single layer, this is only a schematic illustration, and each of the organic emission layers 341, 342, and 343 may include a plurality of layers including a hole injection layer (HIL), a hole transport layer (HTL), an emissive layer (EML), an electron transport layer (ETL), and an electron injection layer (EIL).

Light emission of the organic light emitting device 351 will now be described. When a voltage is applied between the anode 331 and the cathode 335, electrons from the cathode 335 move to the organic emission layer 341 via an EIL and an ETL, and holes from the anode 331 move to the organic emission layer 341 via an HIL and an HTL. The electrons and holes injected into the organic emission layer 341 recombine with each other in the organic emission layer 341 and form excitons, and the excitons emit light with a transition from an excited state to a ground state. The brightness of the emitted light is proportional to the amount of current flowing between the anode 331 and the cathode 335.

To individually control the organic light emitting devices 351, 352, and 353, a thin film transistor (TFT) array layer 320 including a plurality of transistors (not shown) is disposed on the substrate 310. The TFT array layer 320 may include a gate line, a data line perpendicularly intersecting the gate line, a switching TFT connected to the gate line and the data line, a driving TFT between the switching TFT and a power line and connected to an organic light emitting device, and a storage capacitor connected between a gate electrode of the driving TFT and the power line.

The amount of current supplied to each of the organic light emitting devices 351, 352, and 353 is controlled according to a data signal controlled according to an image signal, and brightness of each of the organic light emitting devices 351, 352, and 353 is controlled.

A pixel defining layer 362 is disposed between the organic light emitting devices 351, 352, and 353. In other words, after the anodes 331, 332, and 333 serving as pixel electrodes are formed on the TFT array layer 320, the pixel defining layer 362, formed of an insulative material, is formed on the TFT array layer 320 such that at least portions of upper surfaces of the anodes 331, 332, and 333 are exposed. The organic emission layers 341, 342, and 343 and the cathode 335 are sequentially formed on the exposed upper surfaces of the anodes 331, 332, and 333, and a capping layer 367 for protecting the organic emission layers 341, 342, and 343 is formed on the cathode 335.

The anodes 331, 332, and 333 may be formed as reflective electrodes. Each of the anodes 331, 332, and 333 may include a reflective layer formed of Ag, Mg, Al, Pt, Pd, Au, Ni, Nd, Ir, Cr, or a compound thereof, and a transparent layer formed of indium tin oxide (ITO), indium zinc oxide (IZO), zinc oxide (ZnO), indium oxide ($In_2O_3$), indium gallium oxide (IGO), or aluminum zinc oxide (AZO). The anodes 331, 332, and 333 may have, for example, a stacked structure such as ITO/Ag/ITO.

The cathode 335 may be formed as a (semi) transparent electrode so that light emitted by the organic emission layers 341, 342, and 343 may be transmitted. For example, the cathode 335 may include a layer formed by depositing Li, Ca, LiF/Ca, LiF/Al, Al, Mg, Ag, Yb, or a compound thereof toward the organic emission layers 341, 342, and 343, and a transparent layer formed of ITO, IZO, ZnO, or $In_2O_3$ on the layer. The cathode 335 may have, for example, a layer where Ag and Mg are mixed.

The color filter 200 may be disposed on a path of light transmitted and emitted by the cathode 335. For example, the color filter 200 may be disposed on the capping layer 367.

The description above relates to top-emission type OLED panel, but the OLED panel 300 may be formed as a bottom-emission type. In this case, in contrast to a top-emission type, the cathode 335 is formed as a reflective electrode and the anodes 331, 332, and 333 are formed as (semi) transparent electrodes. The cathode 335 may include a reflective layer formed of Li, Ca, LiF/Ca, LiF/Al, Al, Ag, Mg, Yb, or a compound thereof. The anodes 331, 332, and 333 may be formed of ITO, IZO, ZnO, $In_2O_3$, IGO, or AZO. The anodes 331, 332, and 333 may employ an ITO/Ag/ITO structure as a transparent electrode structure. The configurations of the anodes 331, 332, and 333 and the cathode 335, and the materials respectively used to form the anode 331, 332, and 333 and the cathode 335 are not limited to those described above, and various modifications may be made thereto.

When the OLED panel 300 is of a bottom-emission type, the color filter 200 may be disposed on a path of light transmitted and emitted by the anodes 331, 332, and 333. For example, the color filter 200 may be disposed on a bottom surface of the substrate 310 or may be disposed between the TFT array layer 320 and the substrate 310.

Because the color filter 200 includes, as described above, metal nanoparticles having different sizes for different filter regions such that luminance of color formation is improved, color light having improved color reproducibility and improved luminance may be realized from light that is controlled according to image information and emitted by the OLED panel 300.

Figure 18:
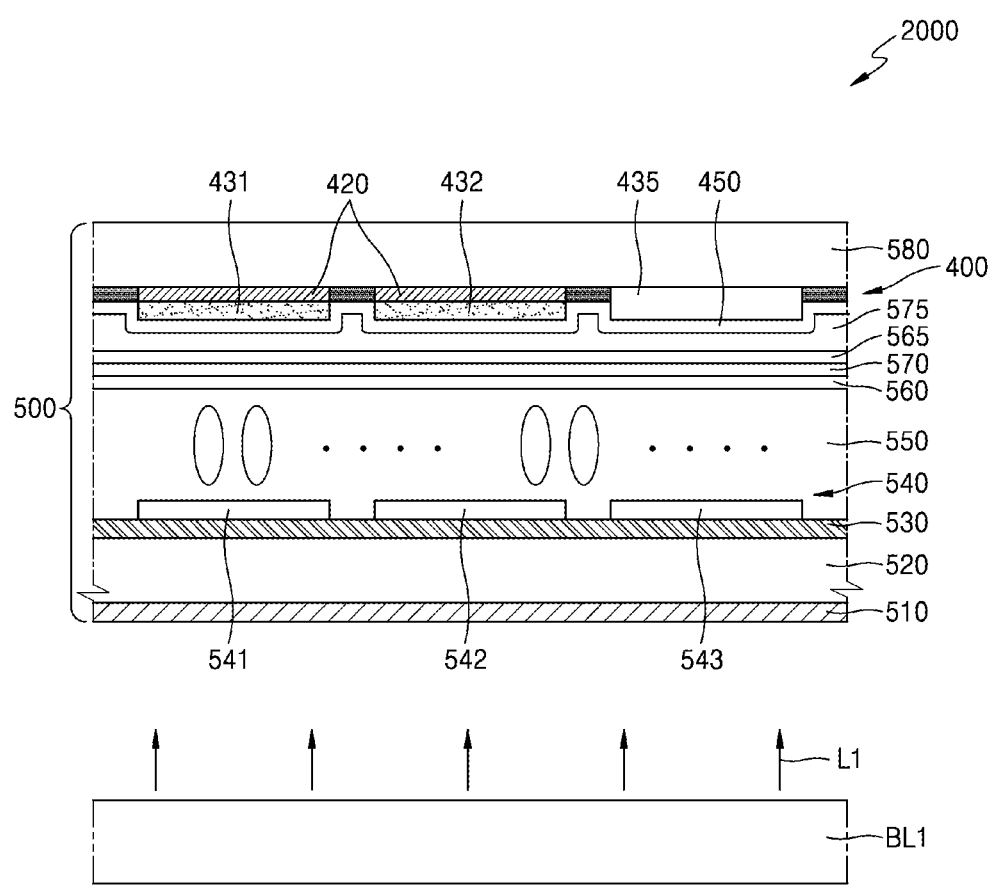
FIG. 18 is a schematic cross-sectional view of a structure of a liquid crystal display (LCD) according to an embodiment.

FIG. 18 is a schematic cross-sectional view of a structure of a liquid crystal display (LCD) 2000 according to an embodiment.

The LCD 2000 includes a backlight device BL1 that provides light L1 for image formation, and a liquid crystal panel 500 that modulates light emitted from the backlight device BL1 and displays an image. The liquid crystal panel 500 includes a color filter 400 for color formation.

The light L1 provided by the backlight device BL1 may be blue light.

The liquid crystal panel 500 includes a first substrate 520 on which a pixel electrode unit 540 is disposed, a second substrate 580 on which a common electrode 560 is disposed, and a liquid crystal layer 550 interposed between the first substrate 520 and the second substrate 580. The color filter 400 is disposed on an inside surface of the second substrate 580, namely, on a surface of the second substrate 580 that faces the liquid crystal layer 550.

A first polarization plate 510 may be disposed on a lower surface of the first substrate 520. The first polarization plate 510 transmits only light having a specific polarization. For example, the first polarization plate 510 may transmit light linearly polarized in a first direction. The first polarization plate 510 may be an absorptive polarization plate that transmits the light linearly polarized in the first direction and absorbs light polarized in a direction perpendicular to the first direction. However, embodiments are not limited thereto.

A TFT array layer 530 is disposed between the first substrate 520 and the pixel electrode unit 540 and includes a plurality of transistors (not shown) for respectively controlling areas of the liquid crystal layer 550 that respectively correspond to pixel electrodes 541, 542, and 543.

The TFT array layer 530 may include a plurality of transistors (not shown), and gate lines and data lines for respectively applying gate signals and data signals to the plurality of transistors. The pixel electrodes 541, 542, and 543 are connected to respective drain electrodes of the transistors formed in the TFT array layer 530, and apply data voltages.

The liquid crystal layer 550 is disposed between the first substrate 520 and the second substrate 580. An arrangement of liquid crystal molecules included in the liquid crystal layer 550 is adjusted according to a voltage applied to between the common electrode 560 and each of the pixel electrodes 541, 542, and 543. A voltage applied to the pixel electrodes 541, 542, and 543 according to a data signal controlled according to an image signal is controlled via the TFT array layer 530. The areas of the liquid crystal layer 550 between the common electrode 560 and the pixel electrodes 541, 542, and 543 are controlled to switch between an on mode in which the polarization of incident light changes or an off mode in which the polarization of the incident light does not change. The degree of change of the polarization of the incident light is adjusted, and thus an intermediate grayscale may be expressed.

Although not shown in FIG. 18, an alignment layer for aligning the liquid crystal layer 550 may be further included between the liquid crystal layer 550 and the common electrode 560 and/or between the liquid crystal layer 550 and the pixel electrode unit 540.

The first and second substrates 520 and 580 may be formed of a glass material or a transparent plastic material.

The color filter 400 and an in-cell polarization plate 565 are sequentially disposed in this order between the second substrate 580 and the common electrode layer 560 and in a direction from the second substrate 580 to the liquid crystal layer 550.

The color filter 400 may include first and second filters 431 and 432 arranged to respectively correspond to the pixel electrodes 541 and 542, and the first and second filters 431 and 432 may form a red color and a green color, respectively. The color filter 400 may further include a transparent layer 435 formed at a location corresponding to the pixel electrode 543. The transparent layer 435 may be formed of a photoresist material. The structures of the first and second filters 431 and 432 are substantially the same as those of the first and second filters 231 and 232 employed in the color filter 200 of FIG. 16.

Band cut filters 420 may further be provided between the second substrate 580 and the first filter 431 and between the second substrate 580 and the second filter 432. The band cut filters 420 may block blue light. Accordingly, blue light not transformed into red light and green light by the first filter 431 and the second filter 432, respectively, is blocked.

A band pass filter (BPF) 450 and a planarization layer 575 may be sequentially arranged between the color filter 400 and the in-cell polarization plate 565, and a passivation layer 570 may be arranged between the in-cell polarization plate 565 and the common electrode 560.

The BPF 450 may transmit blue light and reflect red light and green light. The BPF 450 may be formed by alternately stacking a high-refractive layer and a low-refractive layer, and a transmissive wavelength band may be controlled according to a material and a thickness of the BPF 450. The BPF 450 may be formed by alternately stacking SiNx and SiOx. Only blue light may be incident upon the color filter 400 by the BPF 450.

The in-cell polarization plate 565 may transmit light having a linear polarization in a second direction, which is perpendicular to the light having the linear polarization in the first direction transmitted by the first polarization plate 510. However, this is only an example, and the first polarization plate 510 and the in-cell polarization plate 565 may transmit light having linear polarizations in the same direction. The in-cell polarization plate 565 may be a wire grid polarization plate. The wire grid polarization plate is an arrangement of a plurality of metal wires, and reflects a polarization in a lengthwise direction of the metal wires and transmits a polarization in a direction perpendicular to the lengthwise direction. Because the wire grid polarization plate may be thinner than the first polarization plate 510, the first polarization plate 510 being an absorptive polarization plate, the wire grid polarization plate is capable of being disposed on the inside surface of the second substrate 580.

Because the LCD 2000 uses a modulation method of controlling the polarization of the incident light by using the liquid crystal layer 550 as described above, the LCD 2000 employs the in-cell polarization plate 565 disposed on the inside surface of the second substrate 580, so that the metal nanoparticles, the quantum dots, and the like included in the color filter 400 do not affect the modulation method. In other words, light modulated while passing through the first polarization plate 510, the liquid crystal layer 550, and the in-cell polarization plate 565 may be incident upon the color filter 400 and form a color image. However, embodiments are not limited to this arrangement.

Because the color filter 400 includes, as described above, metal nanoparticles having different sizes for different filter regions such that luminance of color formation is improved, color light having improved color reproducibility and improved luminance may be realized from light controlled according to image information and emitted by the liquid crystal panel 500.

Figure 19:
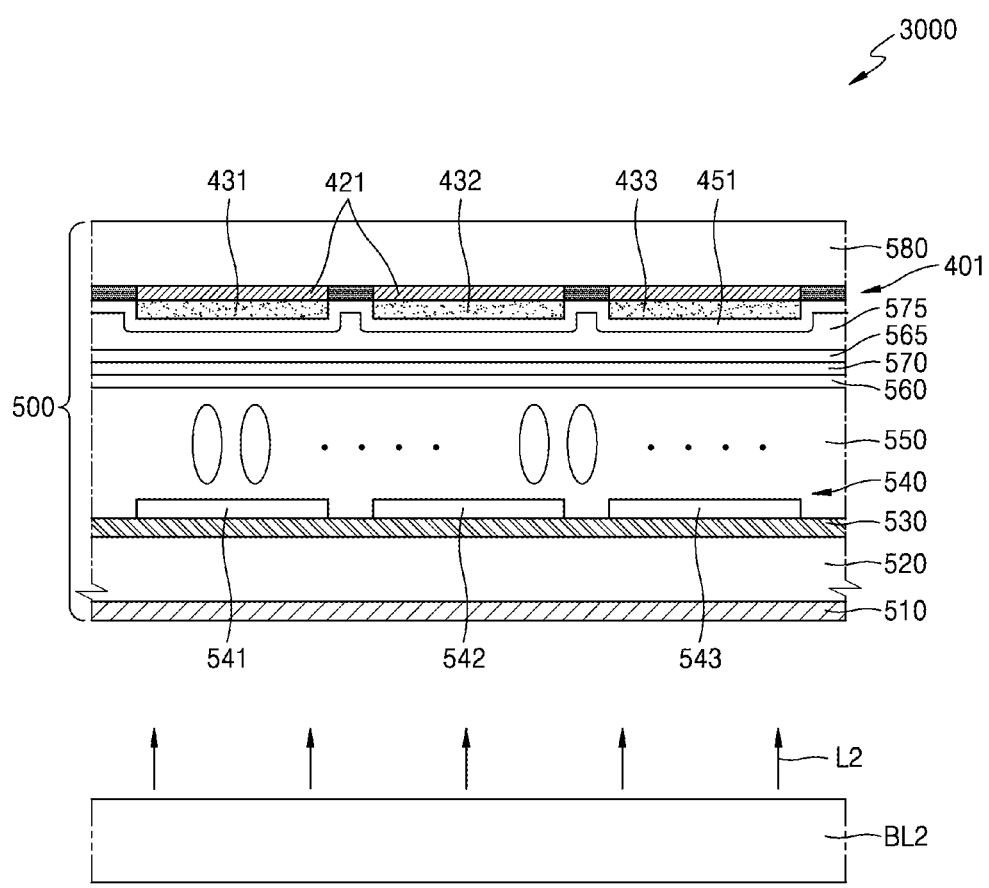
FIG. 19 is a schematic cross-sectional view of a structure of an LCD according to another embodiment.

FIG. 19 is a schematic cross-sectional view of a structure of an LCD 3000 according to another embodiment.

The LCD 3000 according to the present embodiment is different from the LCD 2000 of FIG. 18 in that a backlight device BL2 emitting ultraviolet (UV) light L2 is used, and that a first filter 431, a second filter 432, and a third filter 433 of a color filter 401 respectively form a red color, a green color, and a blue color. The color filter 401 is substantially the same as the color filter 200 of FIG. 16 including the first, second, and third filters 231, 232, and 233.

According to the backlight device BL2 and the color filter 401, band cut filters 421 respectively disposed on filter regions of the color filter 401 may block UV light and a BPF 451 disposed below the color filter 401 may transmit the UV light. Only UV light is incident upon the color filter 401 by the BPF 451, and UV light not transformed into red light, green light, and blue light by the first, second, and third filters 431, 432, and 433 of the color filter 401, respectively, is blocked by the band cut filters 421.

Examples of a display apparatus that may employ a color filter according to an embodiment are not limited to the above descriptions. For example, an LCD may be implemented as not only the above-described transmissive type but also as a reflective type using external light, or an LCD may be implemented as a transflective type corresponding to a combination of the transmissive type and the reflective type.

In a transflective method, each pixel region is divided into two regions, namely, a reflective region and a transmissive region. In addition, light from a backlight device or external light is selected according to illumination of the external light and used as image forming light.

The above-described color filter includes quantum dots, a color forming material, and metal nanoparticles to thereby providing a color having high luminescent efficiency and high color reproducibility.

The above-described color filter may form a plurality of colors having different wavelengths. In this case, sizes of metal nanoparticles used to form different colors are controlled to increase efficiency of luminance improvement for each color.

The above-described color filter is applicable to various display apparatuses and is able to provide a high-quality image.

While the inventive concept has been particularly shown and described with reference to embodiments thereof, it will be understood by those of ordinary skill in the art that various changes in form and details may be made therein without departing from the spirit and scope as defined by the following claims.

What is claimed is:

1. A color filter comprising a first filter exhibiting a first color and a second filter exhibiting a second color, the first filter comprising:
    a first color forming material;
    a first quantum dot;
    a first metal nanoparticle having a first predetermined size, wherein a distance between the first metal nanoparticle and the first quantum dot is determined such that the first metal nanoparticle and the first quantum dot form a resonance structure, and
    first graft molecules directly formed on a surface of the first metal nanoparticle, and
the second filter comprising:
    a second color forming material;
    a second quantum dot;
    a second metal nanoparticle having a second predetermined size, wherein the second predetermined size is larger than the first predetermined size, and
    second graft molecules directly formed on a surface of the second metal nanoparticle,
    wherein each of the first graft molecules and each of the second graft molecules are made from an alkyl group, lengths of each of the first graft molecules and each of the second graft molecules are determined based on luminescence intensity of the first filter and/or the second filter, and each of the first graft molecules and each of the second graft molecules have a length of from 10 nm to 20 nm.

2. The color filter of claim 1, wherein the first color has a wavelength shorter than that of the second color.

3. The color filter of claim 1, wherein each of the first metal nanoparticle and the second metal nanoparticle has a shape with a non-angulated curved surface.

4. The color filter of claim 3, wherein each of the first metal nanoparticle and the second metal nanoparticle has a spherical shape.

5. The color filter of claim 1, wherein
    a plurality of first metal nanoparticles and a plurality of second metal nanoparticles are included in the first filter and the second filter, respectively, and
    the first metal nanoparticles and the second metal nanoparticles are spaced apart from each other.

6. The color filter of claim 1, wherein
    the first metal nanoparticle and the first quantum dot are spaced apart from each other, and
    the second metal nanoparticle and the second quantum dot are spaced apart from each other.

7. The color filter of claim 6, wherein
    a distance between the second metal nanoparticle and the second quantum dot is determined such that the second metal nanoparticle and the second quantum dot form a resonance structure.

8. The color filter of claim 1, wherein the first metal nanoparticle and the second metal nanoparticle comprise Au, Ag, Al, Al2O3, Co, Cu, Cr, Pt, Ni, Fe, Mo, or W.

9. The color filter of claim 1, further comprising a third filter exhibiting a third color, the third filter comprising a third color forming material, a third quantum dot having a different size from the first and second quantum dots, and a third metal nanoparticle having a third predetermined size which is different from the first predetermined size and the second predetermined size.

10. The color filter of claim 9, wherein the third predetermined size is longer than those of the first predetermined size and the second predetermined size, and
    wherein the first color has a wavelength shorter than that of the second color and the second color has a wavelength shorter than that of the third color.

11. The color filter of claim 9, wherein the first quantum dot has a size smaller than that of the second quantum dot and the second quantum dot has a size smaller than that of the third quantum dot.

12. A display apparatus comprising:
    a display unit comprising a plurality of pixel regions controlled according to an image signal; and
    a color filter comprising a plurality of filter regions respectively corresponding to the plurality of pixel regions,
    wherein the color filter comprises:
        a first filter comprising a first color forming material, a first quantum dot, and a first metal nanoparticle, the first filter exhibiting a first color; and
        a second filter comprising a second color forming material, a second quantum dot having a different size from the first quantum dot, and a second metal nanoparticle having a different size from the first metal nanoparticle, the second filter exhibiting a second color, wherein a distance between the first metal nanoparticle and the first quantum dot is determined such that the first metal nanoparticle and the first quantum dot form a resonance structure; and
        graft molecules directly formed on each surface of the first metal nanoparticle and the second metal nanoparticle,
        wherein each of the graft molecules is made from an alkyl group, a length of each of the graft molecules is determined based on luminescence intensity of the first filter and/or second filter, and each of the graft molecules have a length of from 10 nm to 20 nm.

13. The display apparatus of claim 12, wherein
    the display unit is a transmissive type liquid crystal panel, and
    the display apparatus further comprises a backlight unit that provides blue light.

14. The display apparatus of claim 12, wherein the color filter further comprises a third filter comprising a third color forming material, a third quantum dot having a different size from the first and second quantum dots, and a third metal nanoparticle having a different size from the first and second metal nanoparticles, the third filter exhibiting a third color.

15. The display apparatus of claim 14, wherein each of the first metal nanoparticle, the second metal nanoparticle, and the third metal nanoparticle has a shape with a non-angulated curved surface.

16. The display apparatus of claim 15, wherein a metal nanoparticle included in a filter that exhibits a color of a longer wavelength, from among the first metal nanoparticle, the second metal nanoparticle, and the third metal nanoparticle, has a larger size than the other metal nanoparticles.

17. The display apparatus of claim 14, wherein
the display unit is a transmissive type liquid crystal panel, and
the display apparatus further comprises a backlight unit that provides ultraviolet (UV) light.

* * * * *